United States Patent
Tanaka et al.

(10) Patent No.: US 7,361,905 B2
(45) Date of Patent: Apr. 22, 2008

(54) SUBSTRATE PROCESSING APPARATUS AND MAINTENANCE METHOD THEREFOR

(75) Inventors: Toshiharu Tanaka, Niihama (JP); Itsushi Iio, Niihama (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 568 days.

(21) Appl. No.: 10/820,732

(22) Filed: Apr. 9, 2004

(65) Prior Publication Data

US 2004/0211924 A1 Oct. 28, 2004

(30) Foreign Application Priority Data

Apr. 10, 2003 (JP) .......................... P2003-106532

(51) Int. Cl.
*H01L 21/302* (2006.01)
(52) U.S. Cl. .............................. 250/442.11; 250/492.3; 355/39
(58) Field of Classification Search ............ 250/442.11
See application file for complete search history.

(56) References Cited

U.S. PATENT DOCUMENTS

| | | | |
|---|---|---|---|
| 3,968,885 A * | 7/1976 | Hassan et al. .............. 414/591 |
| 5,831,272 A | 11/1998 | Utsumi | |
| 6,497,239 B2 * | 12/2002 | Farmer et al. ............. 134/56 R |
| 6,529,260 B2 * | 3/2003 | Sogard ......................... 355/39 |
| 6,602,349 B2 * | 8/2003 | Chandra et al. .............. 134/19 |

FOREIGN PATENT DOCUMENTS

| JP | 10-303099 | 11/1998 |
|---|---|---|
| JP | 11-255489 | 9/1999 |

OTHER PUBLICATIONS

Nozue et al., "Development of Next-Generation Electron-Beam Exposure Systems", Oyo Buturi, vol. 71, No. 4, pp. 421-424 (2002).

* cited by examiner

*Primary Examiner*—Jack I. Berman
*Assistant Examiner*—Phillip A. Johnston
(74) *Attorney, Agent, or Firm*—Arent Fox LLP

(57) ABSTRACT

A substrate processing apparatus comprises a chamber. The chamber includes a container and an upper lid for closing an upper opening of the container. On the upper side of the chamber, an elevator for vertically moving the upper lid is disposed integrally with the chamber.

11 Claims, 11 Drawing Sheets

SUBSTRATE PROCESSING APPARATUS AND MAINTENANCE METHOD THEREFOR

BACKGROUND OF THE INVENTION

1. Field of the Invention

The present invention relates to a substrate processing apparatus equipped with a chamber for processing a substrate such as a semiconductor wafer, and a maintenance method therefor.

2. Related Background Art

An exposure apparatus utilizing en electron beam is equipped with a vacuum chamber. The vacuum chamber comprises a container and an upper lid for covering an upper opening of the container. The upper lid is provided with an irradiating part for emitting the electron beam, whereas an alignment mechanism for positioning a mask and a substrate is disposed within the container (see, for example, Reference 1: Hiroshi NOZUE and four others, "Development of next-generation electron-beam exposure systems", OYO BUTURI, Vol.71, No.4, p.421-424 (2002)).

In such an exposure apparatus, large-scale maintenance has been carried out in a state where a maintenance jig such as a jib crane or portal crane is used so as to raise the upper lid and draw it to one side, thereby completely opening the upper opening of the container.

SUMMARY OF THE INVENTION

The maintenance utilizing such a maintenance jig requires a large maintenance space and a commensurate space for keeping such a maintenance jig, which may increase the cost of ownership (COO). Also, it takes considerable time to install the jig for maintenance, which elongates the processing stop period (downtime), thereby lowering the processing efficiency.

For solving the problems mentioned above, it is an object of the present invention to provide a substrate processing apparatus which can reduce the cost of ownership and improve the substrate processing efficiency, and a maintenance method therefor.

A substrate processing apparatus of the present invention comprises: a chamber having a container and a lid for closing an opening of the container; and an elevator for moving the lid, disposed integrally with the chamber.

In the substrate processing apparatus, since the elevator for moving the lid is disposed integrally with the chamber, the maintenance space becomes smaller than that conventionally needed, and no space is necessary for keeping the elevator, whereby the cost of ownership is cut down. Also, since the elevator is integrated with the chamber, the time conventionally required for installing jigs for maintenance is unnecessary, which shortens the processing stop period (downtime), thus improving the substrate processing efficiency.

The opening may be provided on top of the container. The elevator may be disposed on an upper side of the chamber. In this configuration, the maintenance space becomes much smaller.

The elevator may have a first pole erected from the upper side of the container so as to extend vertically; a driving source, attached to the upper lid, for outputting a predetermined turning force; and a power converting mechanism for converting the turning force outputted from the driving source into a vertical force for vertically moving the upper lid along the first pole. In this configuration, the turning force outputted from the driving source is converted into a vertical force by the power converting mechanism, whereby the upper lid ascends/descends along the first pole.

The power converting mechanism may include a first tubular member inserted onto the first pole and held by the upper lid so as to be rotatable about the first pole, a first thread provided on an inner face of the first tubular member, and a second thread provided on a surface of the first pole and adapted to engage the first thread. In this case, when rotated about the first tubular member, the first tubular member ascends/descends along the first pole because of the engagement between the first and second threads, thereby vertically moving the upper lid holding the first tubular member.

The elevator may further has a second pole erected from the upper side of the container so as to extend vertically; a second tubular member inserted onto the second pole and held by the upper lid so as to be rotatable about the second pole; a third thread provided on an inner face of the second tubular member; a fourth thread provided on a surface of the second pole and adapted to engage the third thread; and a power transmitting mechanism, disposed between the first and second tubular members, for rotating the second tubular member in synchronization with the first tubular member. In this configuration, the first tubular member is rotated by the turning force from the driving source, and this rotation is transmitted to the second tubular member by way of the power transmitting mechanism, whereby the first and second tubular members rotate in synchronization. Therefore, the first and second tubular members vertically ascend/descend at the same pace along the first and second poles because of the respective engagements between the first and second threads and between the third and fourth threads. As a result, the upper lid ascends/descends in a stable state.

The substrate processing apparatus may further comprise a tubular cover detachably attached to the first pole so as to cover the surface of the first pole. This can protect the grease-coated surface of the first pole. Also, when the lower part of the first pole, i.e., the part lower than the upper lid, is protected by the cover after the upper lid is ascended, the cover can function as a support member, which prevents the upper lid from dropping out.

The chamber may has a substrate holding part for positioning and holding a substrate, and an electron beam irradiating part for irradiating the substrate with an electron beam. The present invention is suitable for writing apparatus and transfer apparatus using such an electron beam.

A maintenance method of the present invention for a substrate processing apparatus having a chamber including a container and an upper lid for closing an upper opening of the container, the method comprising the step of vertically raising the upper lid and carrying out maintenance within the container while the upper lid is held at a position separated by a predetermined distance from above the container.

In this method, the maintenance within the container is carried out while in a state where the upper lid is raised and held at a position separated by a predetermined distance from above the container. Therefore, the space above the chamber is effectively utilized, so as to reduce the maintenance space, thereby cutting down the cost of ownership. Also, since the maintenance is started and terminated by simply moving the upper lid up and down on the upper side of the container, the processing stop period (downtime) can be shortened, which improves the substrate processing efficiency.

The present invention will become more fully understood from the detailed description given hereinbelow and the accompanying drawings. They are given by way of illustration only, and thus should not be considered limitative of the present invention.

DETAILED DESCRIPTION OF THE PREFERRED EMBODIMENTS

In the following, embodiments of the present invention will be explained with reference to the accompanying drawings. In the explanation of the drawings, constituents identical to each other will be referred to with numerals identical to each other without repeating their overlapping descriptions.

Figure 1:
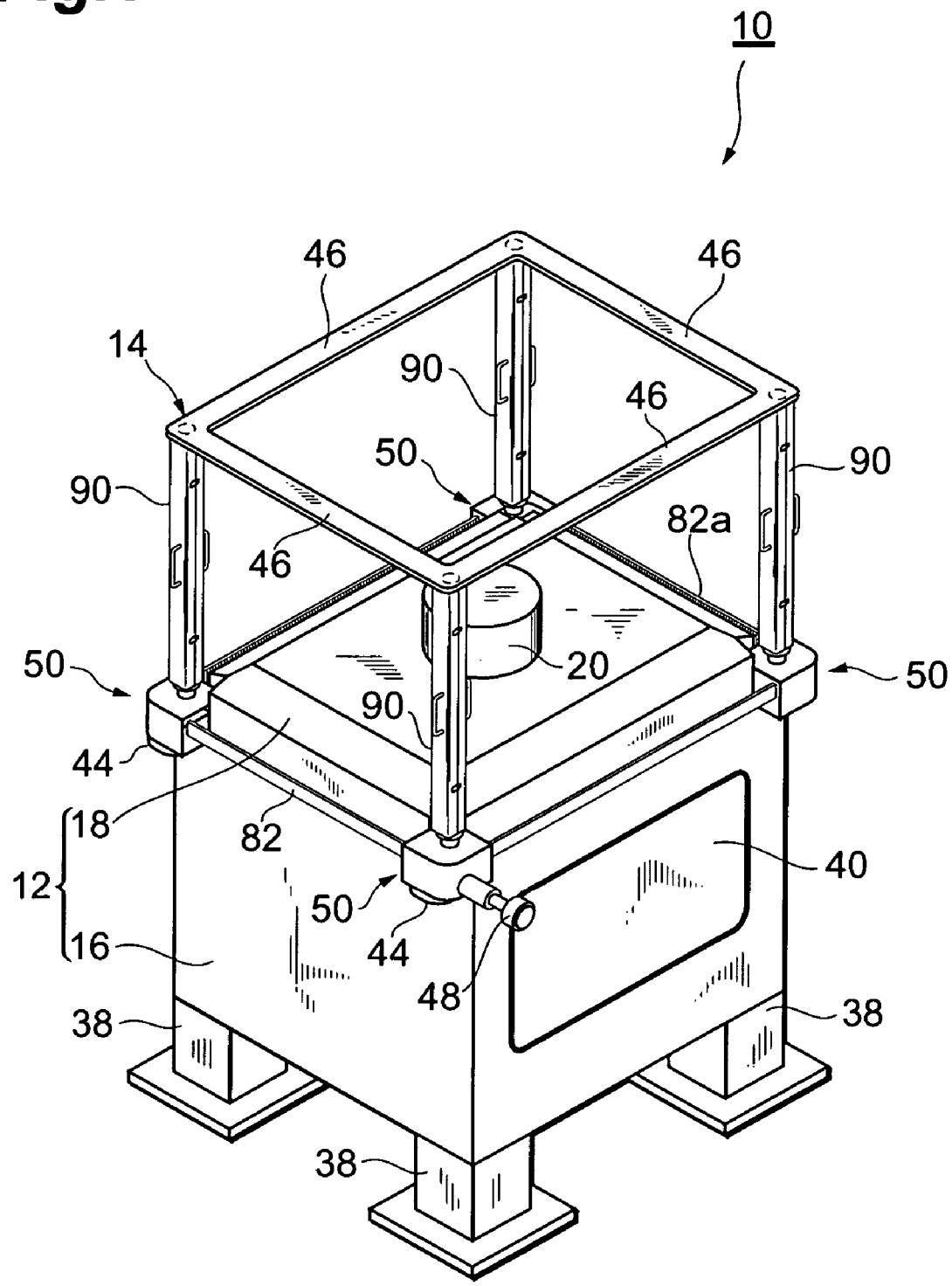
FIG. 1 is a perspective view showing the configuration of an electron beam exposure apparatus as the substrate processing apparatus in accordance with an embodiment.

FIG. 1 is a perspective view showing the configuration of an electron beam exposure apparatus (which may simply be referred to as "exposure apparatus" in the following) as the substrate processing apparatus in accordance with an embodiment. As shown in FIG. 1, this exposure apparatus 10 comprises a vacuum chamber 12 and an elevator 14.

The vacuum chamber 12 comprises a container 16 having an open upper end, and an upper lid 18 for closing the upper opening of the container 16.

Figure 2:
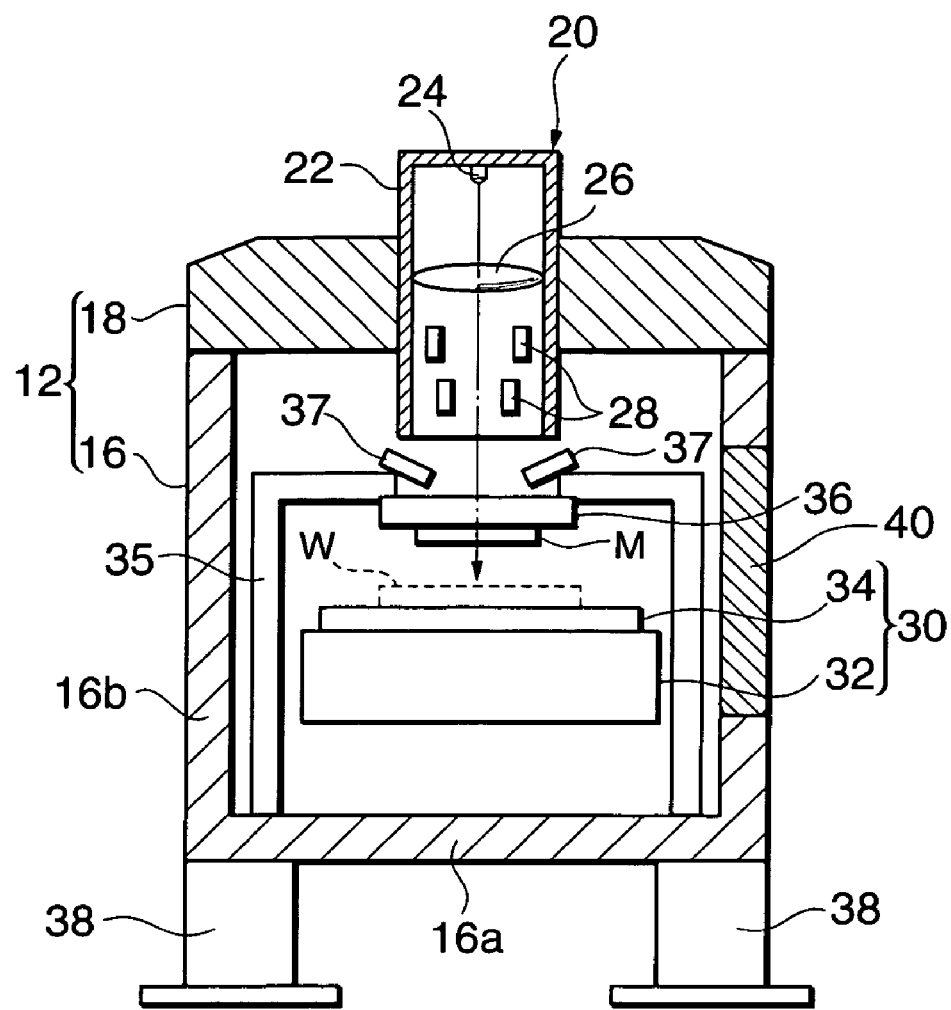
FIG. 2 is a sectional view showing the configuration of a vacuum chamber.

The upper lid 18 has a rectangular horizontal cross section, whereas an electron beam irradiating part 20 for emitting an electron beam is disposed at the center thereof. As shown in FIG. 2, the electron beam irradiating part 20 comprises an electronic lens barrel 22 including an upper wall part and a side wall part, an electron gun 24 attached to the upper wall part in the electronic lens barrel 22, a lens 26 for collimating the electron beam emitted from the electron gun 24, and deflectors 28. The electron gun 24, lens 26, and deflectors 28 are disposed in this order from the upper side to the lower side in the vertical direction, so that the electron beam emitted from the electron gun 24 is collimated by the lens 26 and is scanned by the deflectors 28 so as to illuminate a semiconductor wafer W from thereabove.

As shown in FIGS. 1 and 2, the container 16 comprises a bottom wall part 16a having a rectangular horizontal cross section and two sets of side wall parts 16b erected from edges of the bottom wall part 16a. Accommodated in the container 16 is a wafer stage (substrate holding part) 30 for holding the semiconductor wafer W to be exposed to the electron beam. The wafer stage 30 comprises a positioning stage 32 for positioning the semiconductor wafer W; and an electrostatic chuck 34, mounted on the positioning stage 32, for attracting and holding the semiconductor wafer W. The positioning stage 32 includes a roughly movable stage for rough positioning in two axial directions (XY directions) orthogonal to each other within a horizontal plane; and a finely movable stage, mounted on the roughly movable stage, for fine adjustment in the XY directions, the vertical direction (Z direction) orthogonal to the XY directions, the rotational direction (θ direction) within the horizontal plane, and the inclination. The electrostatic chuck 34 is mounted on the finely movable stage. Therefore, the semiconductor wafer W is positioned by the positioning stage 32 while in a state attracted to the electrostatic chuck 34.

As shown in FIG. 2, the container 16 accommodates a mask stage 36 for positioning and holding a mask M formed with a desirable pattern. The mask stage 36 carries out fine positioning in the rotational direction (θ direction) within the horizontal plane, the vertical direction (Z direction), and the inclination. The mask stage 36 is mounted on a reference base 35 fixed within the vacuum chamber 12.

Also disposed within the container 16 is a photodetector 37 such as a white light microscope, which irradiates the mask M and semiconductor wafer W with light and detects light scattered by undepicted alignment marks. The photodetector 37 is mounted on the reference base 35. Data detected by the photodetector 37 is sent to an undepicted image processor and processed therein, whereby the positional relationship between the mask M and semiconductor wafer W is determined from the overlapping of alignment marks. When there is a positional deviation between the mask M and semiconductor wafer W, a signal for correcting the position of the mask M and/or semiconductor wafer W is generated, and the position of the mask M and/or semiconductor wafer W is minutely corrected according to this signal. As such, the mask M and semiconductor wafer W are positioned with respect to each other precisely. In this embodiment, the mask M is arranged near the semiconductor wafer W (with a gap of about 50 μm therebetween).

The pressure within the vacuum chamber 12 is reduced by an undepicted vacuum pump. Under thus reduced pressure, the whole surface of the mask M is scanned with the electron beam emitted from the electron beam irradiating part 20, whereby the desirable pattern is transferred to a resist on the semiconductor wafer W at 1:1 magnification.

Figure 3:
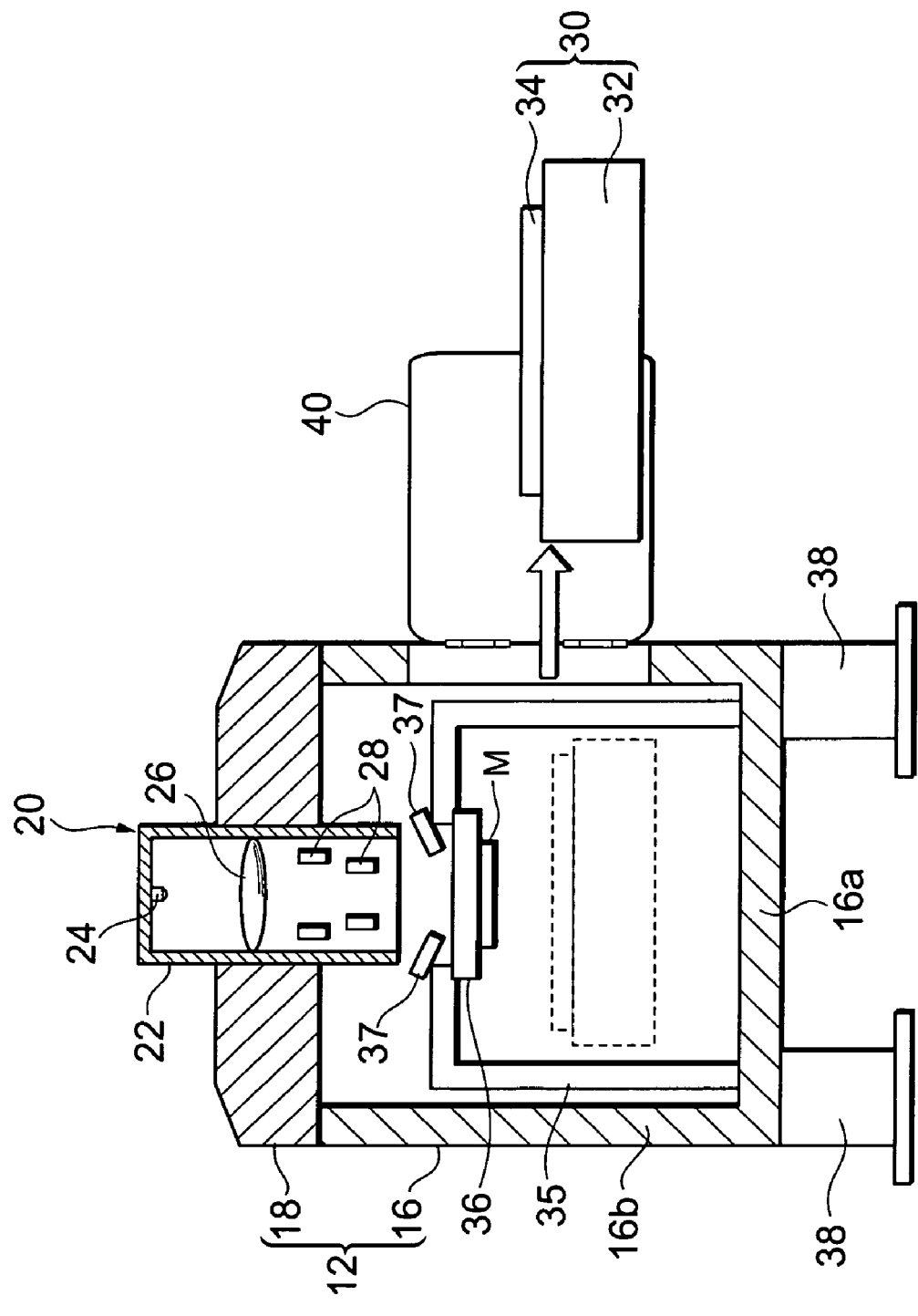
FIG. 3 is a sectional view showing a state where a wafer stage is drawn from a door attached to a side wall of the vacuum chamber.

As shown in FIGS. 1 and 2, the vacuum chamber 12 is mounted on a vibration isolator 38 disposed under the bottom wall part 16a. Also, as shown in FIG. 3, the right wall part of the vacuum chamber 12 is provided with a door 40 which is adapted to open and close. Therefore, the maintenance of the wafer stage 30 can be performed by opening the door 40 and horizontally sliding out the wafer stage 30.

Figure 4:
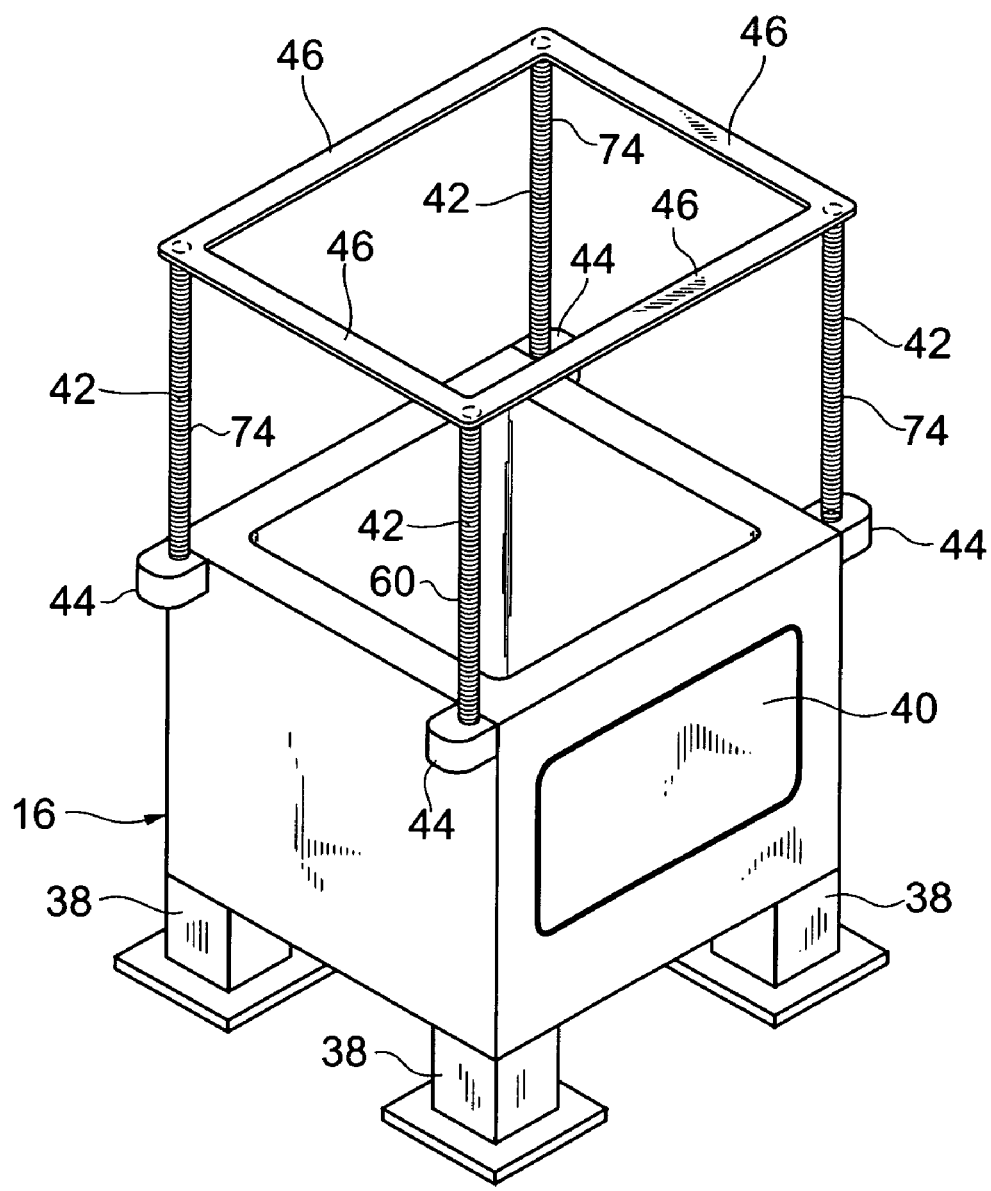
FIG. 4 is a perspective view for explaining a state where guideposts are erected from a container (showing the state without an upper lid for convenience of explanation)

The elevator 14 is disposed integrally with the vacuum chamber 12 on the upper side thereof. FIG. 4 is a perspective view showing the configuration of the vacuum chamber 12 in a state free of the upper lid 18. As shown in FIG. 4, the elevator 14 includes four vertically extending guideposts 42.

As shown in FIG. 4, the guideposts 42 are erected from two pairs of flanges 44 respectively disposed at upper edges of the front and rear wall parts. Connection ribs 46 horizontally connect the upper ends of the guideposts 42, thereby enhancing the rigidity of the guideposts 42.

Figure 5:
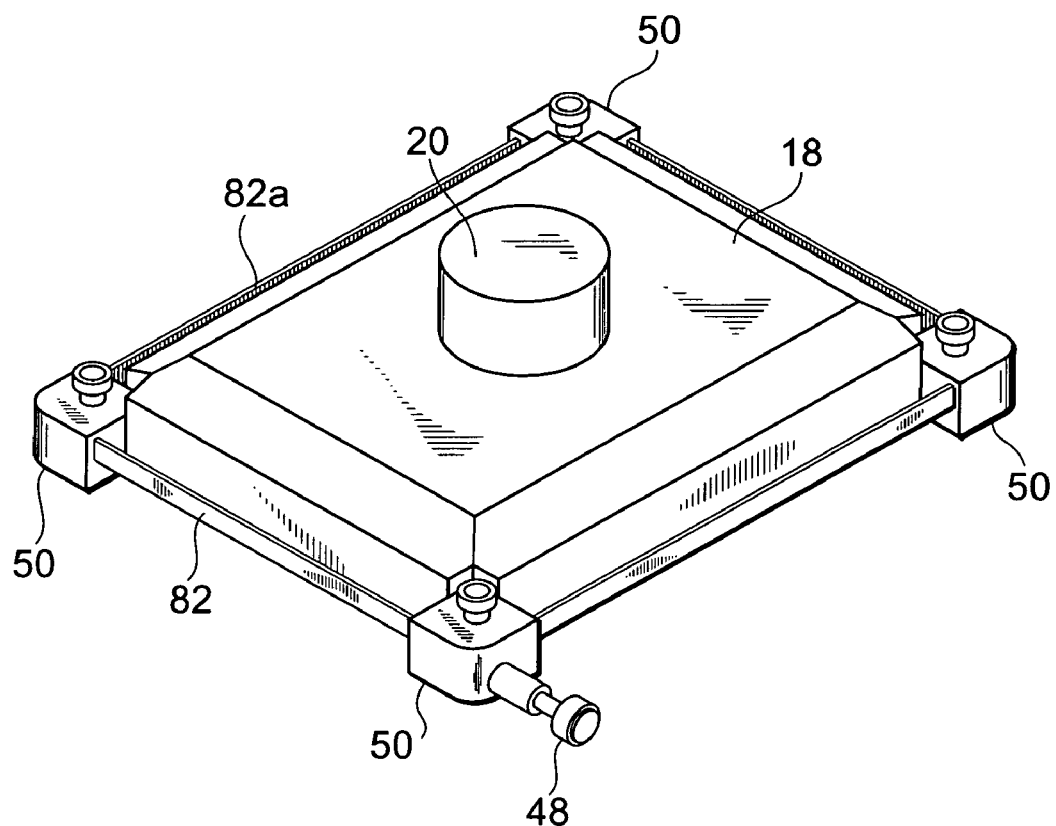
FIG. 5 is a perspective view for explaining the configuration of the upper lid.

The elevator 14 also includes four power converting mechanisms 50 for converting the turning force supplied from a motor (driving source) 48, which will be explained later, into a vertical force for vertically moving the upper lid 18 along the guideposts 42. As shown in FIGS. 1 and 5, the power converting mechanisms 50 are disposed at four corners of the upper lid 18 so as to correspond to the positions where the guideposts 42 are erected from the container 16.

The elevator 14 further includes the motor 48 outputting a predetermined turning force. The motor 48 is integrally provided with the upper lid 18 at a location where one power converting mechanism 50 is disposed. An air motor is preferable as the motor 48 since usual motor comprises magnet and magnetic field formed by the magnet may affect the electron beam.

Figure 6:
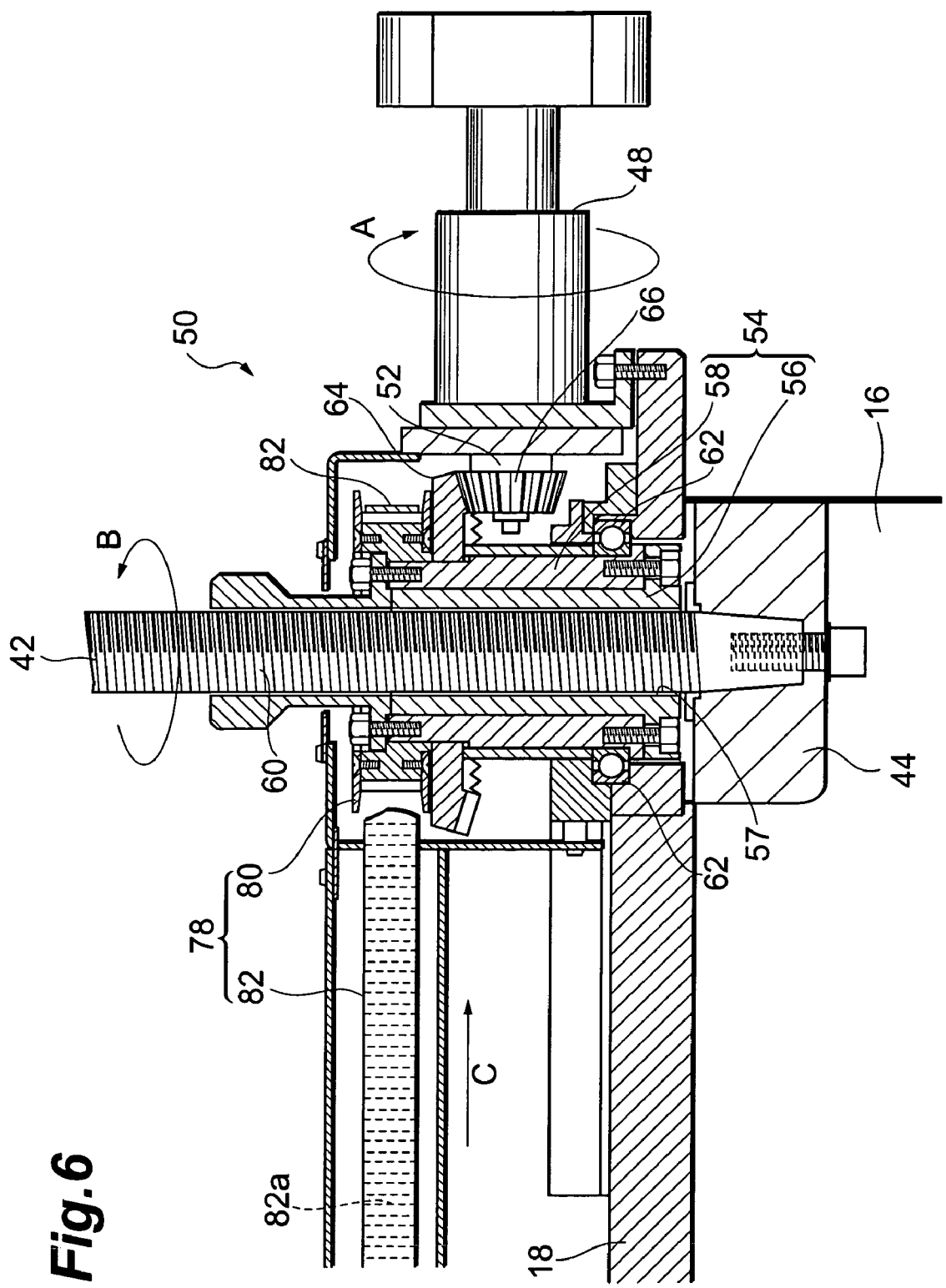
FIG. 6 is a view for explaining a motor and a power converting mechanism which are disposed at a corner of the upper lid.

FIG. 6 is a partly sectional view for explaining in detail the configuration of the motor 48 and the power converting mechanism 50 at a location where the motor 48 is disposed. The motor 48 is arranged such that its output shaft 52 is orthogonal to the vertical direction. The power converting mechanism 50 comprises a tubular member (first tubular member) 54. The tubular member 54 includes a rotary tube 56 and a sleeve 58 disposed about the outer peripheral face of the rotary tube 56 so as to be rotatable integrally therewith. The tubular member 54 is inserted onto the guidepost (first pole) 42 and is held by the upper lid 18 so as to be rotatable about the guidepost 42. The inner face of the rotary tube 56 in the tubular member 54 is provided with a thread (first thread) 57. On the other hand, the surface of the guidepost 42 is provided with a thread (second thread) 60 adapted to engage the thread 57 of the rotary tube 56. Therefore, when the tubular member 54 rotates about the guidepost 42, the tubular member 54 can ascend and descend along the guidepost 42 because of the engagement between the threads 57 and 60. A bearing 62 is provided between the sleeve 58 of the tubular member 54 and the upper lid 18, whereas the tubular member 54 is held by the upper lid 18 while in a state rotatable about the guidepost 42 by way of the bearing 62.

A bevel gear 64 is secured to the outer peripheral face of the sleeve 58 in the tubular member 54. The output shaft 52 of the motor 48 is provided with a bevel gear 66 adapted to engage the bevel gear 64 attached to the sleeve 58. Therefore, as the output shaft 52 of the motor 48 rotates in the direction of arrow A in FIG. 6, the rotational movement of the output shaft 52 is converted into a rotational movement of the tubular member 54 in the direction of arrow B in FIG. 6 about the guidepost 42. The tubular member 54 rotates about the guidepost 42, thereby ascending along the guidepost 42 because of the engagement between the threads 57 and 60. Here, since the tubular member 54 is held with the upper lid 18 by way of the bearing 62, the upper lid 18 moves up along the guidepost 42 when the tubular member 54 ascends along the guidepost 42.

Figure 7:
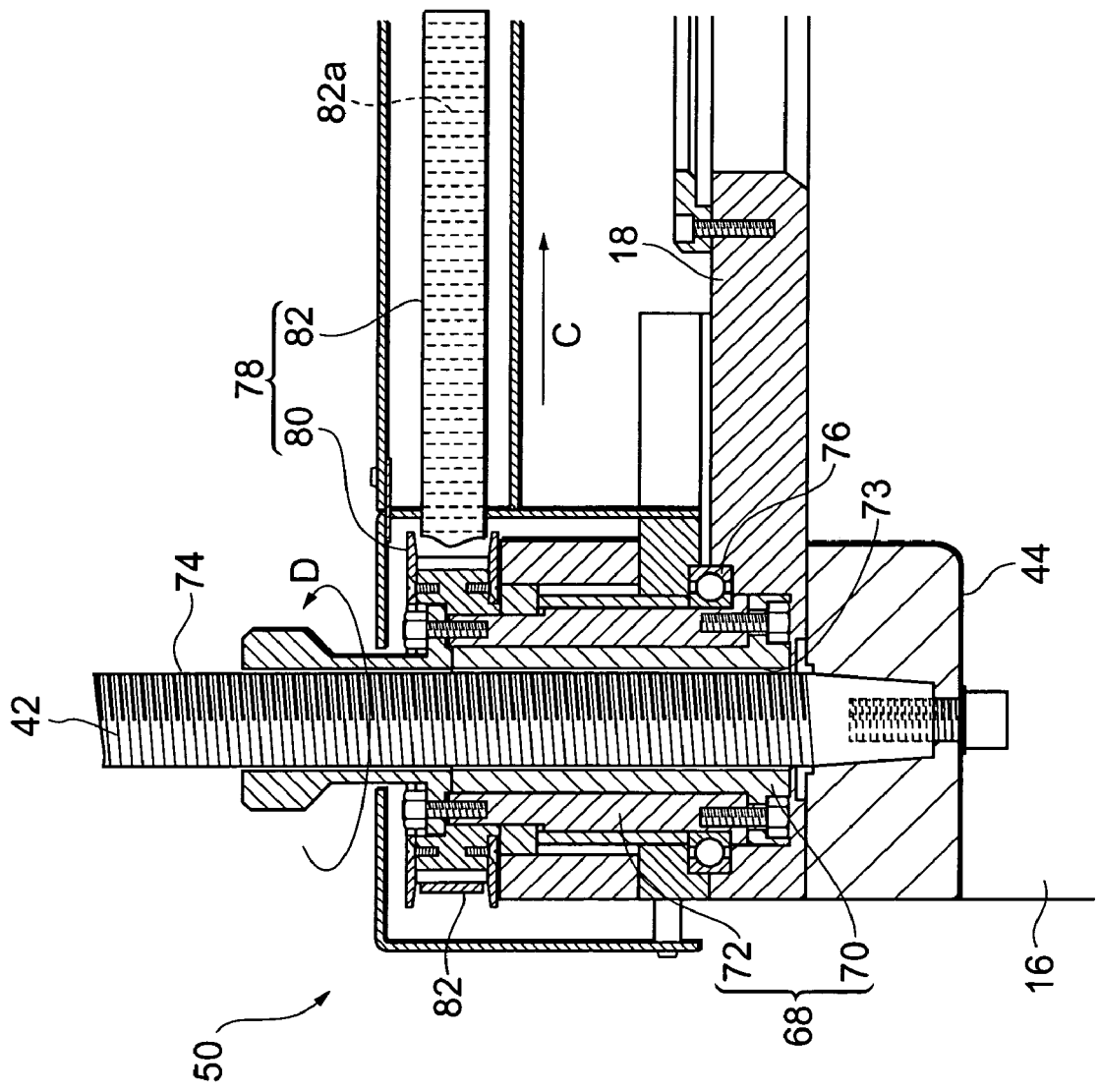
FIG. 7 is a view for explaining a power converting mechanism disposed at any of the other three corners of the upper lid.

FIG. 7 is a partly sectional view for explaining in detail the configuration of the power converting mechanism 50 at a location not provided with the motor 48. This power converting mechanism 50 comprises a tubular member (second tubular member) 68. The tubular member 68 includes a rotary tube 70 and a sleeve 72 disposed about the outer peripheral face of the rotary tube 70 so as to be rotatable integrally therewith. The tubular member 68 is inserted onto the guidepost (second pole) 42 and is held by the upper lid 18 so as to be rotatable about the guidepost 42. The inner face of the rotary tube 70 in the tubular member 68 is provided with a thread (third thread) 73. On the other hand, the surface of the guidepost 42 is provided with a thread (fourth thread) 74 adapted to engage the thread 73 of the rotary tube 70. Therefore, when the tubular member 68 rotates about the guidepost 42, the tubular member 68 can ascend and descend along the guidepost 42 because of the engagement between the threads 73 and 74. A bearing 76 is provided between the sleeve 72 of the tubular member 68 and the upper lid 18, whereas the tubular member 68 is held by the upper lid 18 while in a state rotatable about the guidepost 42 by way of the bearing 76.

Here, between the tubular member 54 of the power converting mechanism 50 at the location provided with the motor 48 and the tubular member 68 of the power converting mechanism 50 at the location not provided with the motor 48, a power transmitting mechanism 78 for transmitting the turning force of the motor 48 is disposed as shown in FIGS. 6 and 7. The power transmitting mechanism 78 includes pulleys 80 disposed on the upper outer peripheral faces of the sleeves 58, 72 in the tubular members 54, 68, respectively, and a timing belt 82 horizontally surrounding the pulleys 80. The timing belt 82 includes a plurality of protrusions 82a which are disposed at predetermined intervals on the inner face thereof and engage their corresponding pulleys 80. Therefore, when the motor 48 is driven so as to rotate the tubular member 54 at the location provided with the motor 48, this rotation is transmitted by way of the timing belt 82 to the tubular members 68 at the locations not provided with the motor 48, whereby the tubular members 54, 68 rotate in synchronization with each other and vertically move along the guideposts 42. As a consequence, the upper lid 18 ascends/descends along the guideposts 42 while in a stable state.

Figure 8:
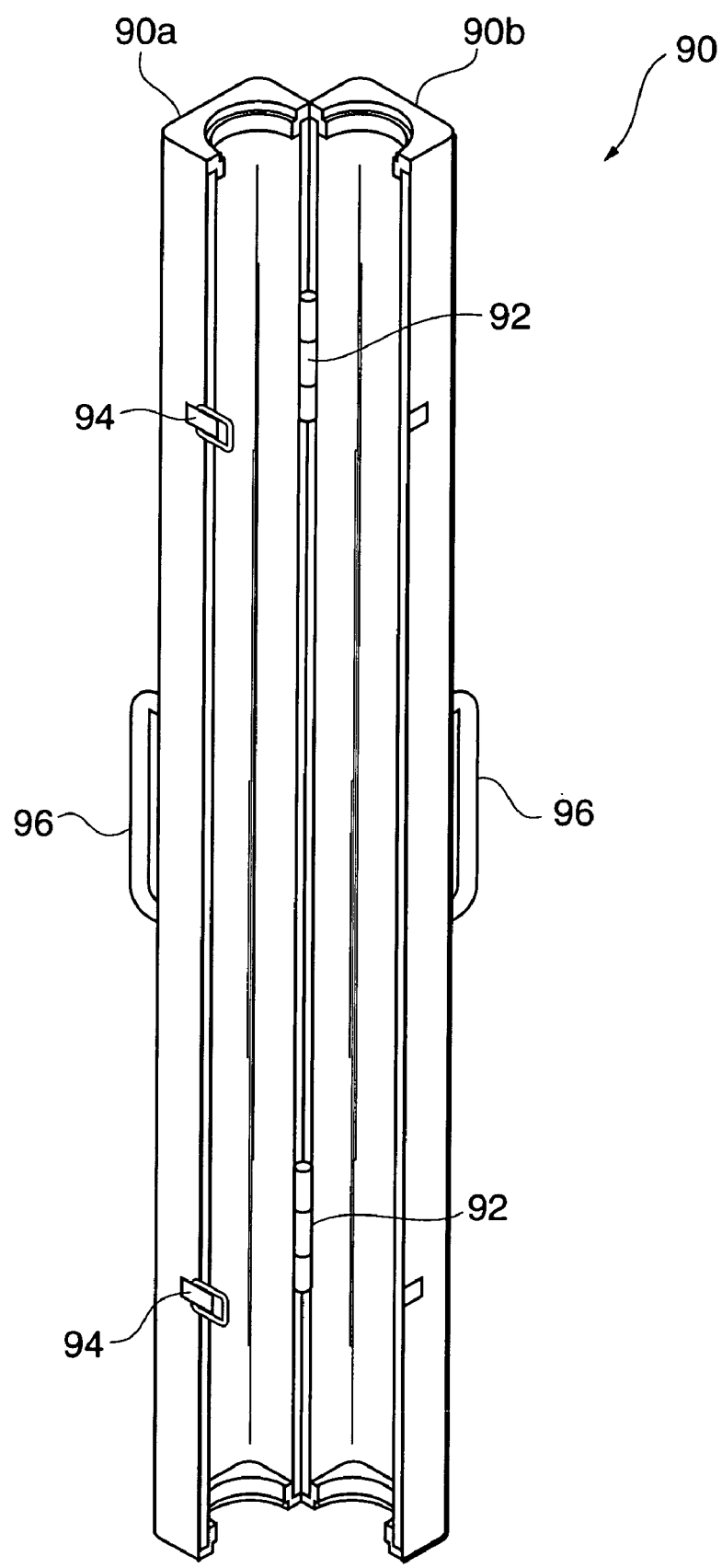
FIG. 8 is a view showing the configuration of a cover for surrounding and protecting the surface of a guidepost (in an open state)
Figure 9:
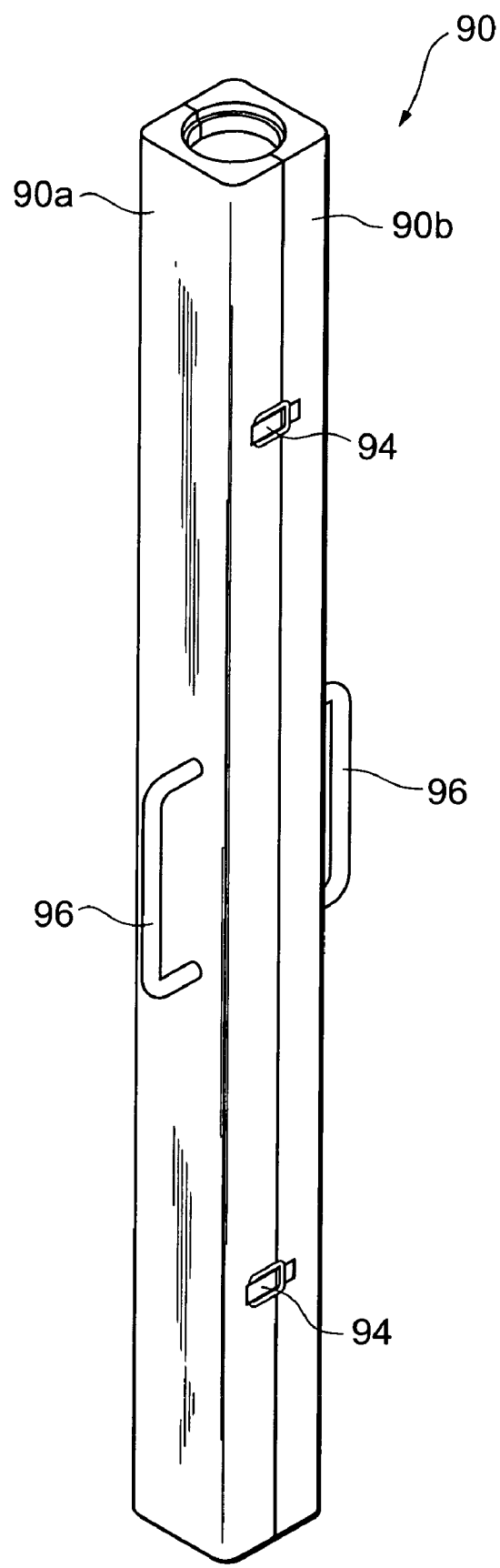
FIG. 9 is a view showing the configuration of a cover for surrounding and protecting the surface of a guidepost (in a closed state)

As shown in FIG. 1, the exposure apparatus 10 in accordance with this embodiment comprises tubular covers 90 surrounding the respective surfaces of the guideposts 42. As shown in FIGS. 8 and 9, each cover 90 is a tubular member whose length is substantially the same as that of each guidepost 42, and is longitudinally split into two parts 90a, 90b. These two parts 90a, 90b are linked by a hinge 92 so as to be able to open and close, whereas the surfaces to be opened and closed are provided with latches 94 for locking. Side faces of the two parts 90a, 90b are provided with handles 96 for making it easier to open and close the cover 90. As shown in FIG. 1, the covers 90 are detachably attached to their corresponding guideposts 42 in a state where the upper lid 18 is located at the lowest position and closes the vacuum chamber 12. This can prevent the grease applied to the surfaces of the guideposts 42 from adhering to human bodies during the maintenance.

In general, retractable covers in the form of bellows or the like have conventionally been used for protecting the grease applied to the threads 60, 74 of the guideposts 42 or preventing the grease from adhering to the others (e.g., human bodies). However, they need a cover margin which can take up about ⅓ to ½ of the movable stroke, and thus may be problematic in terms of space. By contrast, this embodiment needs no cover margin at all, thereby allowing the upper lid 18 to attain a large ascending/descending stroke.

Operations and effects of thus configured exposure apparatus 10 and its maintenance method will now be explained.

Figure 10:
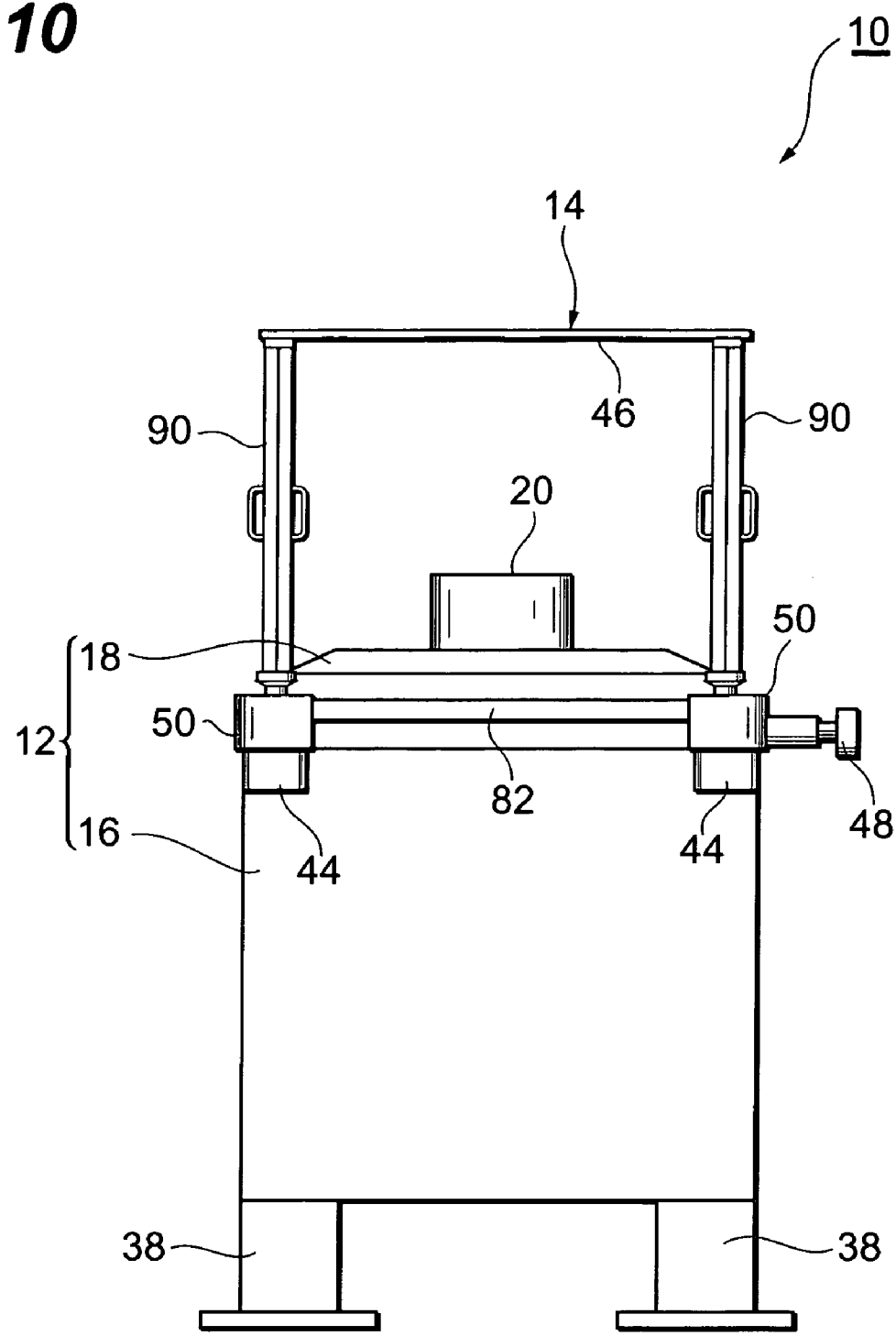
FIG. 10 is a front view showing the electron beam exposure apparatus in a state where the upper lid is located at the lowest position.

At the time of exposure, the upper lid 18 of the vacuum chamber 12 is located at its lowest position and closes the upper opening of the container 16 as shown in FIG. 10. The respective surfaces of the four guideposts 42 are surrounded and protected by their corresponding covers 90. In this state, as shown in FIG. 2, the semiconductor wafer W is fed into the container 16 and is attracted to the electrostatic chuck 34, so as to be positioned by the positioning stage 32. Also, the mask M is fed into the container 16, and is positioned by the mask stage 36. As a consequence, the mask M and the semiconductor wafer W are positioned in a state close to each other.

Then, the electron beam emitted from the electron gun 24 of the electron beam irradiating part 20 is collimated by the lens 26, and the whole surface of the mask M is scanned with the collimated electron beam by the deflectors 28. This transfers a desirable mask pattern to a resist on the semiconductor wafer W at 1:1 magnification.

Figure 11:
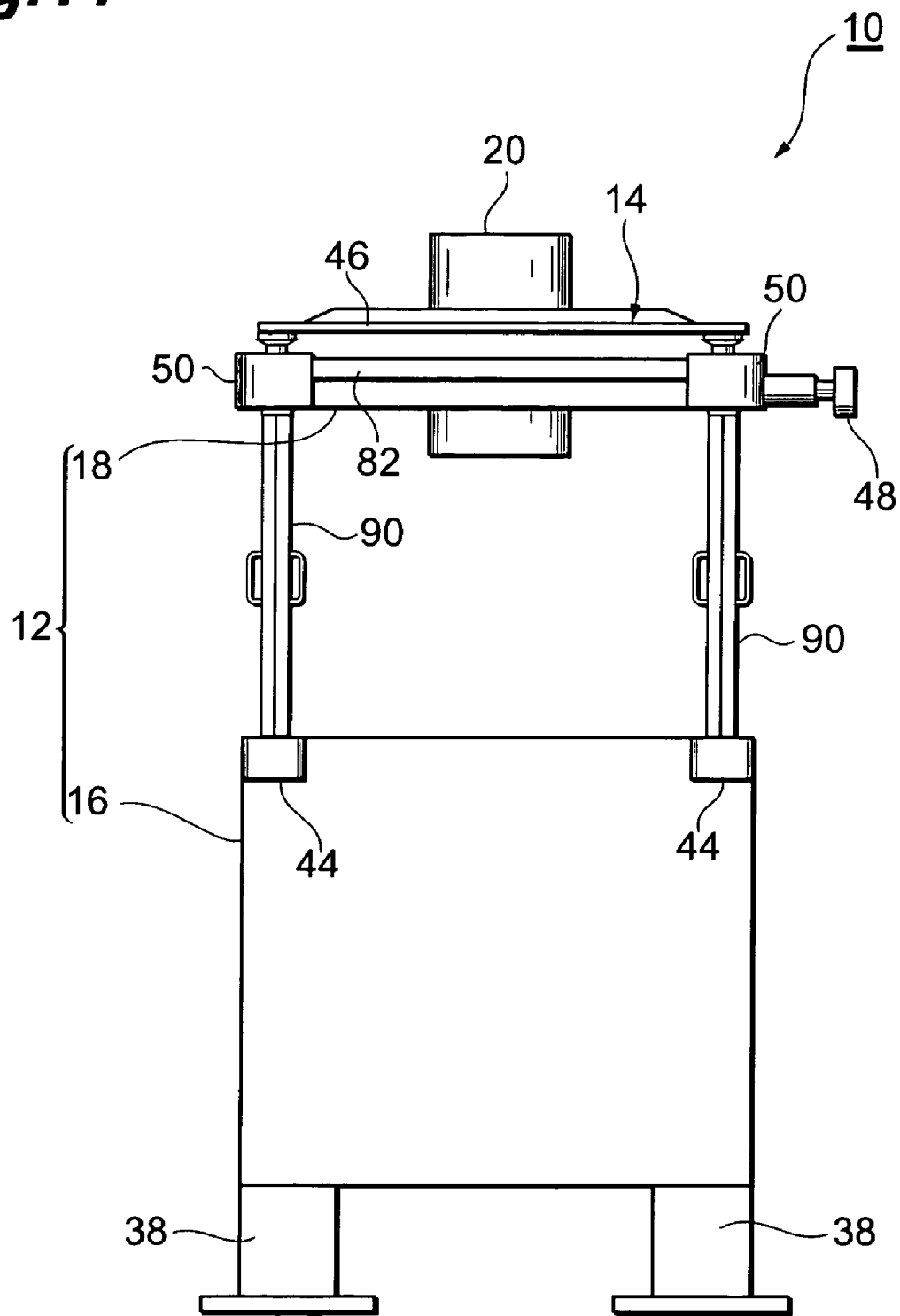
FIG. 11 is a front view showing the electron beam exposure apparatus in a state where the upper lid is located at the highest position.

The foregoing steps are repeated, so as to perform a predetermined number of exposure processes. Maintenance is carried out periodically or upon accidental troubles. Here, as shown in FIG. 11, the upper lid 18 of the vacuum chamber 12 is raised, so as to open the upper opening of the container 16 for maintenance. There is also a case where the door 40 attached to the right wall part of the vacuum chamber 12 is opened as shown in FIG. 3, so as to draw out the wafer stage 30 for maintenance.

First, for raising the upper lid 18, the covers 90 surrounding the surfaces of the four guideposts 42 are removed. Subsequently, as shown in FIG. 6, the motor 48 is driven so as to rotate the output shaft 52 in the direction of arrow A. Then, by way of the bevel gears 66, 64, the rotational movement of the output shaft 52 is converted into a rotational movement of the tubular member 54 in the direction of arrow B about the guidepost 42. The tubular member 54 rotates about the guidepost 42, thereby ascending along the guidepost 42 because of the engagement between the threads 57 and 60. Here, since the tubular member 54 is held with the upper lid 18 by way of the bearing 62, the upper lid 18 moves up along the guidepost 42 when the tubular member 54 ascends along the guidepost 42.

As shown in FIGS. 6 and 7, the rotation of the tubular member 54 at the location provided with the motor 48 is transmitted by way of the timing belt 82 and pulleys 80 to the tubular members 68 at the locations not provided with the motor 48. Namely, as the tubular member 54 at the location provided with the motor 48 rotates in the direction of arrow B in FIG. 6, the timing belt 82 rotates in the direction of arrow C in FIGS. 6 and 7. Hence, as shown in FIG. 7, each of the tubular members 68 at the locations not provided with the motor 48 rotates in the direction of arrow D about its corresponding guidepost 42, thereby ascending along the guidepost 42 because of the engagement between the threads 73, 74. Since the tubular member 68 is held with the upper lid 18 by way of the bearing 76, the upper lid 18 moves up along the guidepost 42 as the tubular member 68 ascends along the guidepost 42. Here, the rotation of the tubular member 54 at the location provided with the motor 48 and the rotations of the tubular members 68 at the locations not provided with the motor 48 are in synchronization with each other by way of the timing belt 82 and pulleys 80, whereby all the tubular members 54, 68 ascend at the same pace. Therefore, the upper lid 18 moves up in a stable state without tilting.

The motor 48 is stopped when the upper lid 18 reaches the upper ends of the guideposts 42 as shown in FIG. 11. Preferably, the highest position of the upper lid 18 is adjusted so as to be higher than its lowest position by a little less than 1 m. Then, the removed covers 90 are attached to the respective guideposts 42 again. As a consequence, when the upper lid 18 is located at the highest position, the covers 90 function as support members, which can prevent the upper lid 18 from accidentally dropping out. When providing the covers 90 with a function of a support member, the covers 90 are required to have a high strength and thus are preferably formed from a material such as stainless steel or a steel sheet. In the state where the upper lid 18 is located at the highest position as such, the maintenance for the alignment stage including the mask stage 36 and photodetector 37 in the container 16, the electron beam irradiating part 20, and the like is carried out.

After the maintenance is completed, the covers 90 are removed from their corresponding guideposts 42, and the motor 48 is rotated in a direction opposite from that at the time of raising the upper lid 18, so as to lower the upper lid 18. When the upper lid 18 reaches the lowest position, the motor 48 is stopped. Then, the covers 90 are attached to their corresponding guideposts 42.

In the exposure apparatus 10 in accordance with this embodiment, as explained in the foregoing, the elevator 14 for vertically moving the upper lid 18 is disposed on the upper side of the vacuum chamber 12, whereby the maintenance space becomes smaller than that conventionally required, and no space is required for keeping the elevator 14. Therefore, the footprint of the exposure apparatus 10 can be utilized efficiently, so that the cost of ownership can be cut down. Since the elevator 14 is provided integrally with the vacuum chamber 12, the time required for installing jigs, which has conventionally been needed for maintenance, becomes unnecessary, whereby the processing stop period (downtime) can be shortened, which improves the substrate processing efficiency.

Without being restricted to the above-mentioned embodiment, the present invention can be modified in various manners. For example, though the motor 48 is arranged such that the output shaft 52 is orthogonal to the vertical direction in the above-mentioned embodiment, the output shaft 52 may extend along the vertical direction. In the latter case, spur gears are preferably used in place of the bevel gears 64, 66 for transmitting power.

Though the above-mentioned embodiment relates to an embodiment of the electron beam exposure apparatus 10 as the substrate processing apparatus, the present invention is also applicable to electron beam writing apparatus which directly write on a substrate without the aid of a mask.

Also, the present invention is applicable to film-forming apparatus (e.g., CVD apparatus and PVD apparatus) and etching apparatus equipped with the vacuum chamber 12.

Further, the present invention is applicable not only to apparatus for processing the semiconductor wafer W, but also to apparatus for making liquid crystal panels, which form films such as ITO films on glass substrates, etc. when forming liquid crystal panels.

From the foregoing explanations of the invention, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A substrate processing apparatus comprising:
a chamber having a container and an upper lid for closing an opening of the container, wherein the upper lid includes an electron beam irradiating part disposed in a center thereof; and an elevator for moving the upper lid, disposed integrally with the chamber; wherein the elevator includes a driving source mounted on and moving together with the upper lid, and wherein a turning force from the driving source is converted into a vertical force to move the upper lid.

2. A substrate processing apparatus according to claim 1, wherein the opening is provided on top of the container; and wherein the elevator is disposed between the upper lid and the container.

3. A substrate processing apparatus according to claim 2, wherein the elevator has:
   a first pole erected from an upper part of the container so as to extend vertically; and
   a power converting mechanism for converting the driving force outputted from the driving source into a vertical force for vertically moving the upper lid along the first pole.

4. A substrate processing apparatus according to claim 3, wherein the power converting mechanism includes:
   a first tubular member inserted onto the first pole and held by the upper lid so as to be rotatable about the first pole;
   a first thread provided on an inner face of the first tubular member; and
   a second thread provided on a surface of the first pole and adapted to engage the first thread.

5. A substrate processing apparatus according to claim 4, wherein the elevator further has:
   a second pole erected from the upper part of the container so as to extend vertically;
   a second tubular member inserted onto the second pole and held by the upper lid so as to be rotatable about the second pole;
   a third thread provided on an inner face of the second tubular member;
   a fourth thread provided on a surface of the second pole and adapted to engage the third thread; and
   a power transmitting mechanism, disposed between the first and second tubular members, for rotating the second tubular member in synchronization with the first tubular member.

6. A substrate processing apparatus according to claim 3, further comprising a tubular cover detachably attached to the first pole so as to cover the surface of the first pole.

7. A substrate processing apparatus according to claim 1, wherein the chamber further comprises a substrate holding part for positioning and holding a substrate and wherein the electron beam irradiating part irradiates the substrate with an electron beam.

8. A substrate processing apparatus according to claim 1, wherein the driving source includes a motor.

9. A substrate processing apparatus according to claim 5, wherein the power transmitting mechanism includes a timing belt.

10. A substrate processing apparatus comprising:
    a chamber having a container and an upper lid for closing an opening of the container;
    a first threaded pole erected from an upper part of the container so as to extend vertically;
    a first tubular member inserted onto and threadably engaged with the first threaded pole; and
    a motor, mounted on and moving together with the upper lid, for rotating the first tubular member about the first threaded pole,
    wherein the first tubular member is held by the upper lid so as to be rotatable about the first threaded pole and the upper lid moves vertically along the first threaded pole when the motor rotates the first tubular member about the first threaded pole.

11. A substrate processing apparatus according to claim 10, further comprising:
    a second threaded pole erected from an upper part of the container so as to extend vertically;
    a second tubular member inserted onto and threadably engaged with the second threaded pole; and
    a timing belt disposed between the first and second tubular members, for rotating the second tubular member in synchronization with the first tubular member;
    wherein the second tubular member is held by the upper lid so as to be rotatable about the second threaded pole and the upper lid moves vertically along the first and second threaded poles when the motor rotates the first tubular member about the first threaded pole and the timing belt rotates the second tubular member about the second threaded pole.

* * * * *